United States Patent [19]

Edell et al.

[11] Patent Number: 5,116,464
[45] Date of Patent: May 26, 1992

[54] CESIUM HYDROXIDE ETCH OF A SEMICONDUCTOR CRYSTAL

[75] Inventors: David J. Edell, Lexington, Mass.; Lloyd D. Clark, Jr., Portsmouth, Va.

[73] Assignee: Massachusetts Institute of Technology, Cambridge, Mass.

[21] Appl. No.: 624,514

[22] Filed: Dec. 7, 1990

Related U.S. Application Data

[63] Continuation of Ser. No. 360,370, Jun. 2, 1989, abandoned.

[51] Int. Cl.$^5$ .............................................. C09K 13/02
[52] U.S. Cl. ........................... 156/647; 156/657.1; 156/656; 156/657; 252/79.5
[58] Field of Search .............. 156/626, 632, 633, 644, 156/647, 662, 659.1, 664, 656, 657; 252/79.5

[56] References Cited

U.S. PATENT DOCUMENTS

| | | | |
|---|---|---|---|
| 3,276,872 | 10/1966 | Fernald | 96/29 |
| 3,579,057 | 5/1971 | Stoller | 156/647 |
| 3,738,881 | 6/1973 | Erdman | 156/647 |
| 3,765,969 | 10/1973 | Kragness et al. | 156/647 |
| 4,215,156 | 7/1980 | Dalal | 156/662 |
| 4,758,368 | 6/1988 | Thompson | 156/662 |

FOREIGN PATENT DOCUMENTS 2651228 11/1976 Fed. Rep. of Germany .
337355 5/1972 U.S.S.R. .

OTHER PUBLICATIONS

Clark, Lloyd D. et al., "Cesium Hydroxide ($C_sOH$): A Useful Etchant for Micromachining Silicon", 1988 Solid-State Sensor and Actuator Workshop, Hilton Head Island, SC, Jun. 6-9, 1988.
Clark, Lloyd D. et al., "KOH:$H_2O$ Etching of (110) Si, (111) Si, $SiO_2$ and Ta: An Experimental Study", IEEE Micro Robots and Teleoperators Workshop Hyannis, MA. Nov. 8-11, 1987.
Hooley, J. G., "The Kinetics of the Reaction of Silica with Group I Hydroxides", Canadian Journal of Chemistry, vol. 39, 1961, pp. 1221-1230.
Izidinov, "On the Mechanism of Inhibition of the Process of Dissolution of Silicon in Alkali in the Presence of Ultraviolet Irradiation", Journal of Physical Chemistry, vol. Lii, No. 10, 1978.
Izidinov et al., "Structural Transformation of Thermal Oxide, and the Photoactivation Kinetics of Passive n-type Silicon in Concentrated Alkali", Soviet Electrochemistry, Russian Original vol. 12, No. 11, Nov. 1976, pp. 1515-1520.
Izidinov et al., "An Ellipsometric Study of the Passivation and the Kinetics of total Photoactivation of Passive n-type Silicon in Concentrated Alkali, Soviet Electrochemistry", Russian Original, vol. 11, No. 3, Mar. 1975, pp. 383-387.
Kargin, Yu. F., et al., "Synthesis and Properties of $Bi_{2-4}E^{3+}P(V)O_{40}$ and $Bi_{36}E^{2+}P_2(V_2)O_{60}$ With Sillenite Structure", UDC548.3:549.516.
Lee, "Anisotropic Etching of Silicon, Journal of Applied Physics", vol. 40, No. 11, Oct. 1969, pp 4569-4574.
Lu, Nicky C. C., "Advanced Cell Structures for Dynamic RAMs", IEEE Circuits and Devices Magazine, Jan. 1989, pp. 27-35.
Notoya, "Kinetic Studies of Electron Transfer Step of Hydrogen Evolution Reaction on Platinum in Aqueous Cesium Hydroxide", J. Res. Inst. Catalysis, Hokkaido Univ. Vol. 9, No. 1, pp. 17-28, 1970.
Obermeier et al., "Characteristics of Polysilicon Layers and Their Application in Sensors", IEEE Solid-State Sensors Workshop, Technical Digest, 1986.
Packter, "Kinetics of the Heterogeneous Reaction of Quartz Powders with Aqueous Sodium Hydroxide So- (List continued on next page.)

Primary Examiner—Michael G. Wityshyn
Assistant Examiner—Todd J. Burns
Attorney, Agent, or Firm—Fish & Richardson

[57] ABSTRACT

An aqueous solution of cesium hydroxide serves as a highly selective anisotropic etch for semiconductor crystals including silicon. The cesium hydroxide also has a high etch selectivity for tantalum with respect to semiconductor crystals.

41 Claims, 7 Drawing Sheets

OTHER PUBLICATIONS lutions at 70° to 115° C". Z. Phys. Chemie, Leipzig 260 (1979) 3, S. 561–568.

Palik et al., "Ellipsometric Study of Orientation-Dependent Etching of Silicon in Aqueous KOH", Journal of the Electrochemical Society, Apr. 1985, pp. 871–884.

Rudenko et al., "The Catalytic Activity of Alkali Metal Ions on the Oxidative Dissolution of Diamond", Kinetics and Catalysis, vol. VIII, No. 2, 1967.

White et al., "Effects of Counterions on Crack Growth in Vitreous Silica", J. Am. Ceram. Soc., 70 (12) pp. 891–95, 1987.

Zdeblick et al., "Microminiature Fluidic Amplifier", Stanford University.

Terry et al., "Application-Specific Packaging for Custom Micromechanical Structures", Transensory Devices, Inc. Fremont CA.

Crary, "Thermal Management of Integrated Microsensors", Electronics Dept., General Motors Research Laboratories, Warren, MI.

Zellers et al., "Thin-Membrane Lamb-Mode Acoustic Oscillators for Chemical Detection", Dept. of Electrical Engineering and Computer Sciences, University of California, Berkeley, CA.

Stemme, "A Monolithic Gas Flow Sensor With Polyimide as Thermal Insulator", Department of Solid State Electronics, Chalmers University of Technology, Sweden, Technical Digest, IEEE Solid-State Sensors Workshop 1986.

Brown, "Considerations in the High-Volume Production of Hybrid Pressure Sensor Modules for Automotive Applications", Delco Electronics Corp., Kokomo, Indiana.

Letter to David L. Feigenbaum from David J. Edell, rcvd. Oct. 20, 1989.

CESIUM HYDROXIDE ETCH OF A SEMICONDUCTOR CRYSTAL

This is a continuation of copending application Ser. No. 07/360,370 filed on Jun. 2, 1989, now abandoned.

BACKGROUND OF THE INVENTION

This invention relates to etching.

In etching silicon, for example, it can be useful to form extremely small, precisely defined features and structures. Such micromachining requires highly selective anisotropic etching of the silicon.

The potassium hydroxide (KOH) etch, for example, yields an etch selectivity of up to 200 (ratio of the etch rate of the (110) crystalline orientation of silicon, to the etch rate of its (111) orientation). Relatively expensive silicon nitride masks must be used with a potassium hydroxide etch. The highly concentrated solutions of potassium hydroxide required for etching also rapidly etch non noble metals of the kinds used to make electrical connections.

Other known etches (including organic etches such as hydrazine solutions or ethylene diamine pyro catechol) are compatible with less expensive silicon dioxide masks, but are not as selective as potassium hydroxide etches.

SUMMARY OF THE INVENTION

In general, the invention features a method for anisotropic etching of a semiconductor crystal in which the crystal is exposed to an aqueous cesium hydroxide solution.

In preferred embodiments, the crystal (e.g., silicon) is masked in a desired pattern using silicon dioxide and the etch comprises in the range of 10% to 68% by weight cesium hydroxide, in an aqueous solution at a temperature between the precipitation temperature and boiling point of the solution.

The variation in etch selectivity with cesium hydroxide concentration is much steeper than that observed with potassium hydroxide concentration FIGS. 10 and 14. For a given CsOH concentration, etch selectivity is nearly temperature independent, FIG. 10, while temperature dependence is observed for the KOH etch at a given KOH concentration, FIG. 14.

Unlike potassium hydroxide, the cesium hydroxide solution etches tantalum slowly, FIGS. 12 and 15, thus allowing use of tantalum as an outer conductive metallization in circuit fabrication. The cesium hydroxide solution also has a much slower silicon dioxide etch rate than potassium hydroxide, FIGS. 11 and 16. Compared with other etches compatible with SiO2 masks such as sodium hydroxide, ammonium hydroxide, hydrazine solutions or ethylene diamine pyro catechol, the cesium hydroxide etch has the advantage of higher selectivity.

Other advantages and features will become apparent from the following description of the preferred embodiment, and from the claims.

DESCRIPTION OF THE PREFERRED EMBODIMENT

We first briefly describe the drawings.

Figure 1:
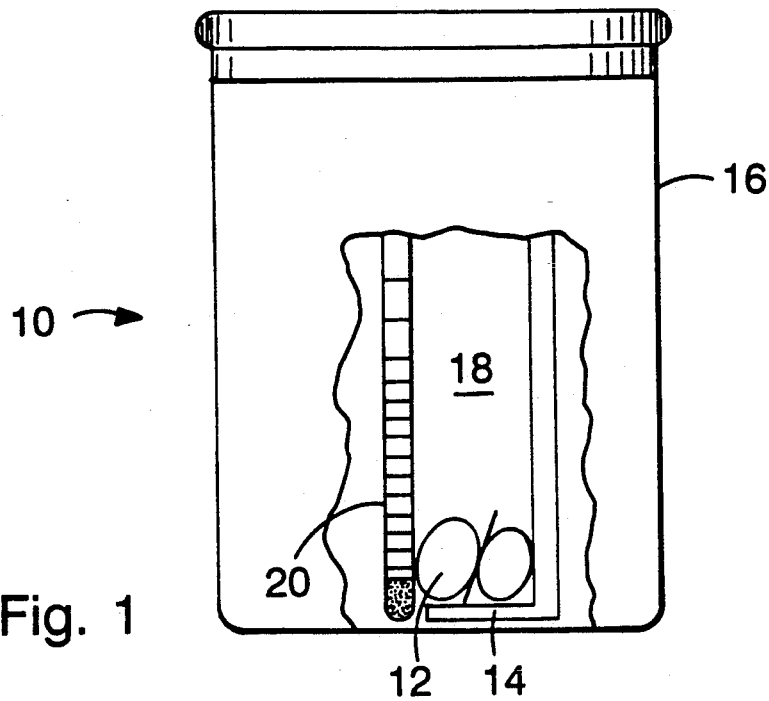
FIG. 1 is a schematic view of apparatus for etching a workpiece.

Referring to FIG. 1, in an experimental etch system for silicon, wafer substrates 12 are supported by a teflon wafer holder 14 in the bottom of a closed polypropylene beaker 16 which contains a cesium hydroxide aqueous solution 18. The temperature of the cesium hydroxide aqueous solution 18 is measured using a glass thermometer 20. The etch system 10 is held in a feedback-controlled oven, not shown, to control the temperature. Etch rates of (110) and (111) orientations of silicon and of tantalum increase with increasing temperature. While rapid etching of the (110) silicon is desirable, temperature must be controlled to achieve acceptable tantalum etching levels. Etch rate test structures can be fabricated to evaluate these etch rates.

Figure 2:
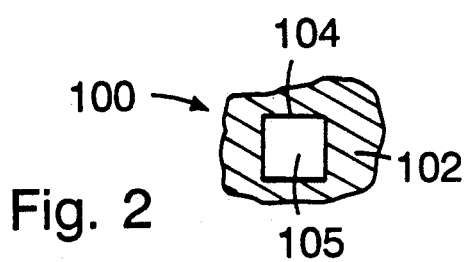
FIG. 2 is a schematic top view of a (110) silicon etch test structure.

Referring to FIG. 2, (110) Si etch test structure 100 was fabricated from a (110) Si wafer, not shown, which had been thermally oxidized with 500 Å of SiO₂ also not shown, and then coated with 1500 Å of LPCVD silicon nitride (Si₃N₄) 102. Square openings, e.g., 104 (1 mm×1 mm) were created through the silicon nitride 102, resulting in the structure shown in FIG. 2. When the test structure 100 was exposed to CsOH:H₂O, the (110) Si 105 (exposed through the square opening) was etched away while the Si₃N₄ 102 acted as a mask for the rest of the substrate.

Figure 3:
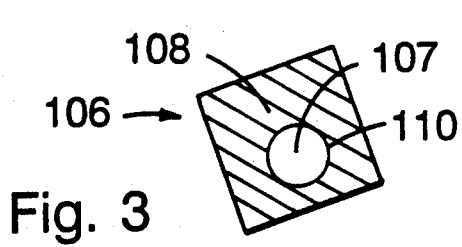
FIG. 3 is a schematic top view of a tantalum etch test structure.

Referring to FIG. 3, tantalum etch test structure 106 consisted of sputter-deposited tantalum 107 on a silicon nitride layer 108 which had been deposited on a silicon wafer, (hidden by the silicon nitride layer). The tantalum 107 was shadow-masked during the deposition process to form 2 mm diameter dots 110, FIG. 3.

Figure 4A:
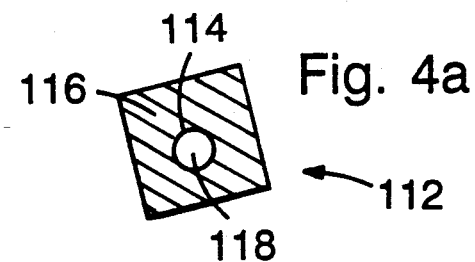
FIG. 4a is a schematic top view of a (111) silicon etch test structure before etching.
Figure 4B:
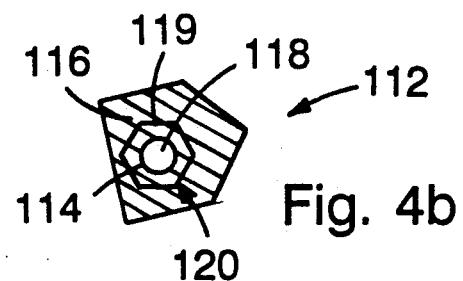
FIG. 4b is a schematic top view of a (111) silicon etch test structure after etching.

Referring to FIG. 4, (111) Si etch test structure 112 was fabricated from a (110) Si wafer, not shown, as above, except that circular openings 114 of 25 μm diameter were created through a silicon nitride layer 116. When the test structure 112 was exposed to CsOH:H₂O, silicon 118 (exposed through the circular openings) etched downward and also laterally until its etching became limited on the (111) planes. The amount of (111) Si etching that had occurred was the minimum lateral distance from the edge of the circle to a flat side 119 of a hexagonal pattern 120 which had appeared on the test structure 112, FIG. 4b.

Figure 5:
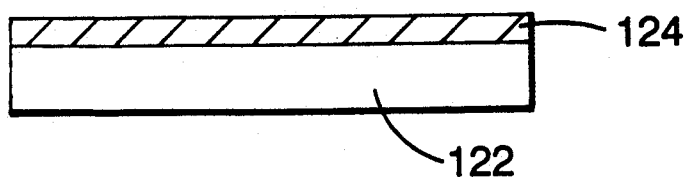
FIG. 5 is a schematic side view of a silicon dioxide etch test structure.

Referring to FIG. 5, the SiO₂ etch test was performed on a silicon wafer 122 upon which an SiO₂ layer 124 had been thermally grown.

CsOH:H₂O etching experiments were performed using the four etch rate test structures, of FIGS. 2-5. Each etching experiment included the following steps:

1. A CsOH:H₂O solution of a specific concentration was mixed from deionized H₂O and solid CsOH (99% pure, metals basis). Solid CsOH hydration must be considered when calculating the true CsOH concentration of the solution. For example, one lot of solid CsOH was 80.4% CsOH by weight; a second lot was 8.8% CsOH by weight.

2. The CsOH:H₂O solution was heated to the desired temperature in a closed polypropylene beaker using the feedback-controlled oven. Glass thermometers were used for temperature measurement. Temperature stability was maintained within ±0.2° C.

3. The etch test structure was placed in the heated CsOH:H₂O solution. The (110) Si and (111) Si etch test structures were given 30 second dips in 10:1 H₂O:HF just prior to the etch to remove any oxide on the silicon, because the presence of even a thin oxide layer on the silicon could have caused severe errors in the silicon etch rate measurement. (It has been reported that even a thin silicon dioxide film is sufficient to prevent an organic hydrazine, iso 2-propyl alcohol and water low selectivity etch from reacting with the silicon surface, Lee, Journal of Applied Physics 40, 1969 4569-4574.)

4. The etch test structure was removed from the solution and measured using the following techniques: (a) (110) Si etch distance was measured to an accuracy of 1 μm (±2%) by taking the difference in focal plane height of a microscope focused first on the unetched silicon nitride and then on the etched silicon; (b) (111) Si etch distance was measured to an accuracy of 0.1 μm (±2%) with linewidth measurement equipment; (c) SiO₂ etch distance was measured to an accuracy of 10 Å (±1%) with an interferometric thin film measurement instrument; (d) Ta etch distance was determined to an accuracy of 100 Å (±20%) with a mechanical step height measurement instrument. In each case, the etch rate was computed from the measured etch distance and etch time.

The results of the etching experiments are plotted in FIGS. 6-13.

Figure 6:
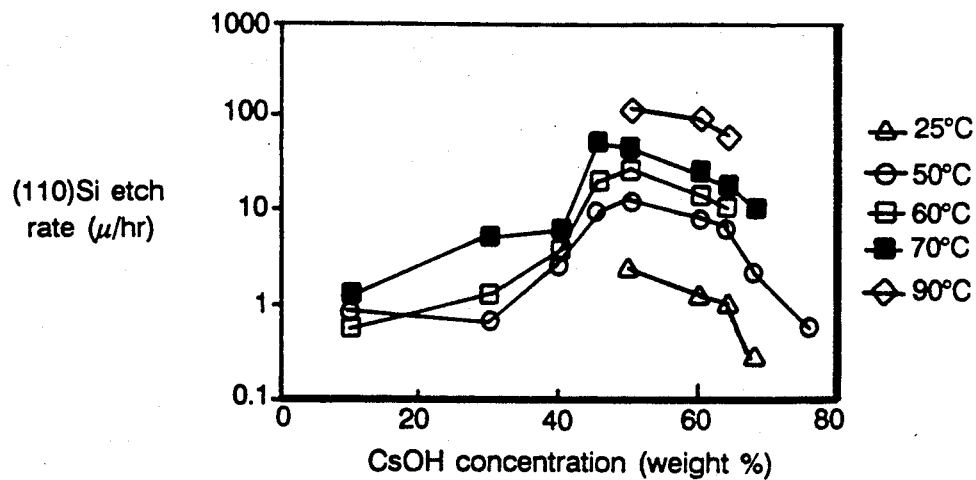
FIG. 6 is a graph of the (110) silicon etch rate as a function of cesium hydroxide concentration.

FIG. 6 shows a (110) silicon etch rate that is greatest in the range 45% to 65% by weight cesium hydroxide and drops off above and below those percentages. The highest (110) silicon etch rate occurs in a 50% by weight cesium hydroxide solution maintained at 90° C.

Figure 7:
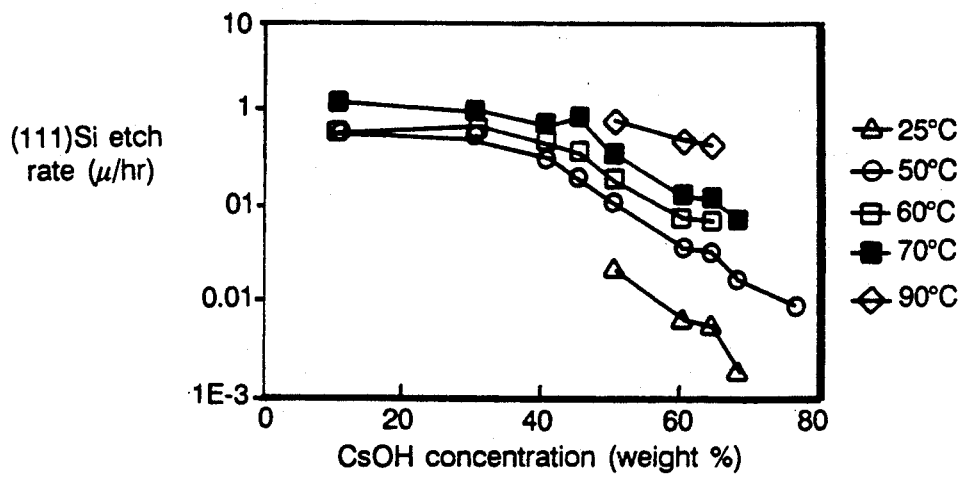
FIG. 7 is a graph of the (111) silicon etch rate as a function of cesium hydroxide concentration at various temperatures.

FIG. 7 shows a (111) silicon etch rate that is nearly insensitive to variations in cesium hydroxide concentration for less than 40% by weight cesium hydroxide. At temperatures below 90° C., the (111) silicon etch rate exhibits a distinct decrease. At 90° C., this sharp decrease in etch rate for cesium hydroxide concentrations greater than 40% by weight is not observed.

Figure 8:
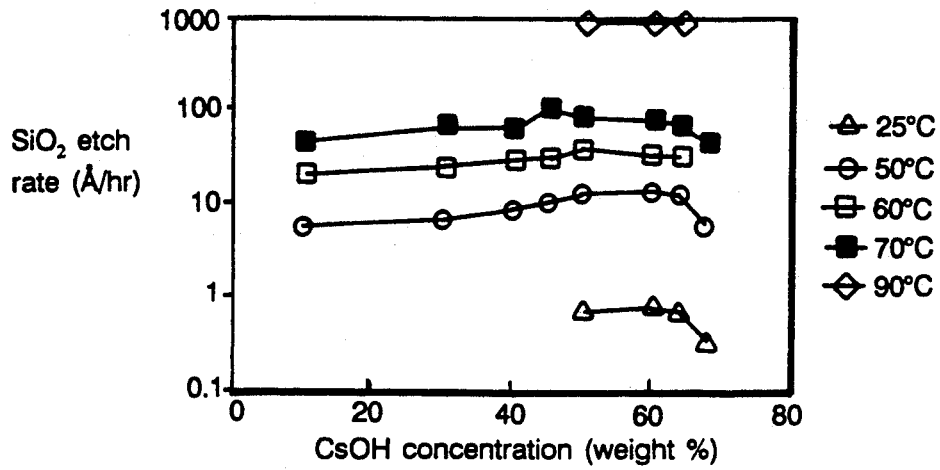
FIG. 8 is a graph of the silicon dioxide etch rate as a function of cesium hydroxide concentration at various temperatures.

FIG. 8 shows a silicon dioxide etch rate that is nearly insensitive to variation in cesium hydroxide concentration over a broad range from 10% to 68% by weight cesium hydroxide. Between 50° C. and 70° C., silicon dioxide etch rates are within the same order of magnitude. They are significantly lower at 25° C. and significantly higher at 90° C.

Figure 9:
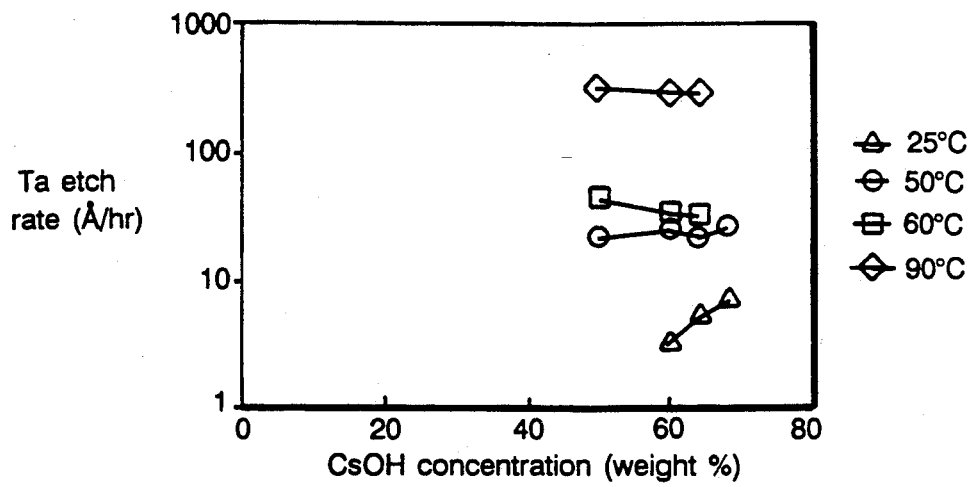
FIG. 9 is a graph of the tantalum etch rate as a function of cesium hydroxide concentration at various temperatures.

FIG. 9 shows a tantalum etch rate that is nearly insensitive to variation in cesium hydroxide concentration over the range 45% to 68% by weight cesium hydroxide, except at 25° C. The tantalum etch rate does depend strongly on temperature and is nearly three orders of magnitude higher at 90° C. than at 25° C., for a 60% by weight cesium hydroxide concentration.

Figure 10:
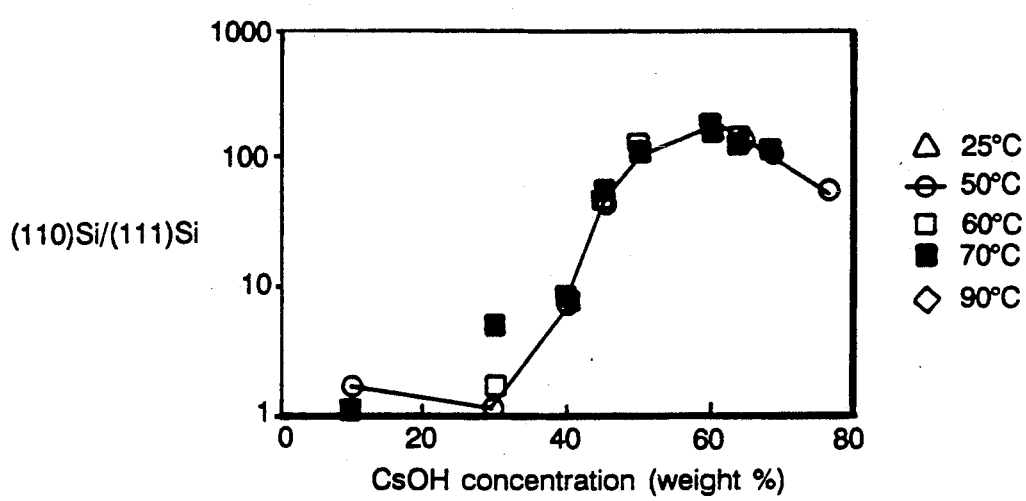
FIG. 10 is a graph of the ratio of the 110/111 silicon etch rates as a function of cesium hydroxide concentration at various temperatures.

FIG. 10 shows how the ratio of the (110) silicon etch rate to the (111) silicon etch rate, i.e. the etch selectivity, depends on cesium hydroxide concentration. The greatest etch selectivity is achieved in the range of 50% to 65% by weight cesium hydroxide, with maximum etch selectivity at 60% by weight cesium hydroxide. Although both the (110) silicon and (111) silicon etch rates peak at 50% by weight cesium hydroxide concentration, the (111) silicon etch rate decreases more rapidly between 45% and 60% by weight cesium hydroxide than does the (110) silicon etch rate, resulting in an etch rate for (110) silicon two hundred times greater than for (111) silicon at 60% by weight cesium hydroxide. The etch selectivity is nearly insensitive to variation in temperature over the range 15% to 70% by weight cesium hydroxide.

Figure 11:
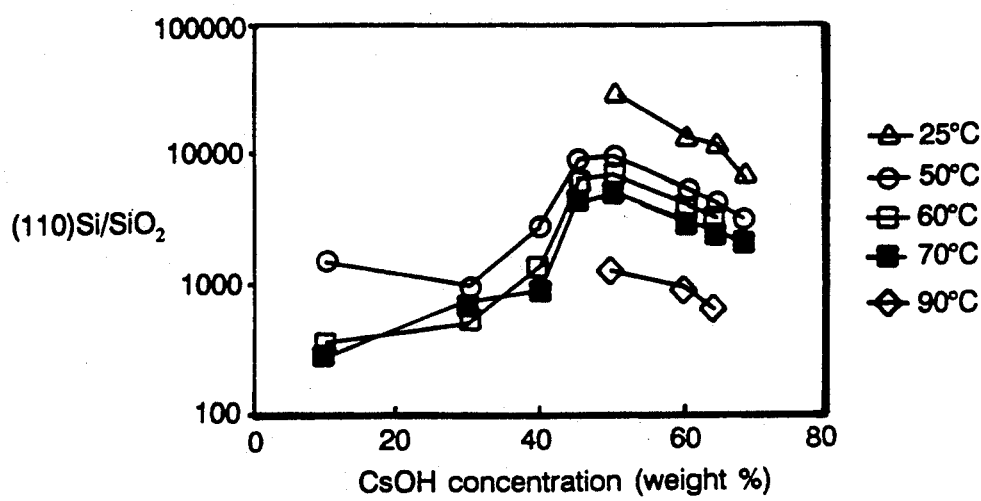
FIG. 11 is a graph of the ratio of the (110) silicon etch rate to the silicon dioxide etch rate as a function of cesium hydroxide concentration at various temperatures.

FIG. 11 shows that the (110) silicon etch rate is between three hundred to three thousand times faster than that of silicon dioxide over the range 10% to 68% by weight cesium hydroxide concentration between 25° C.-70° C. The ratio of the etch rate of (110) silicon to that of silicon dioxide reaches its maximum of 3000 at 25° C. for a 50% by weight cesium hydroxide solution.

Figure 12:
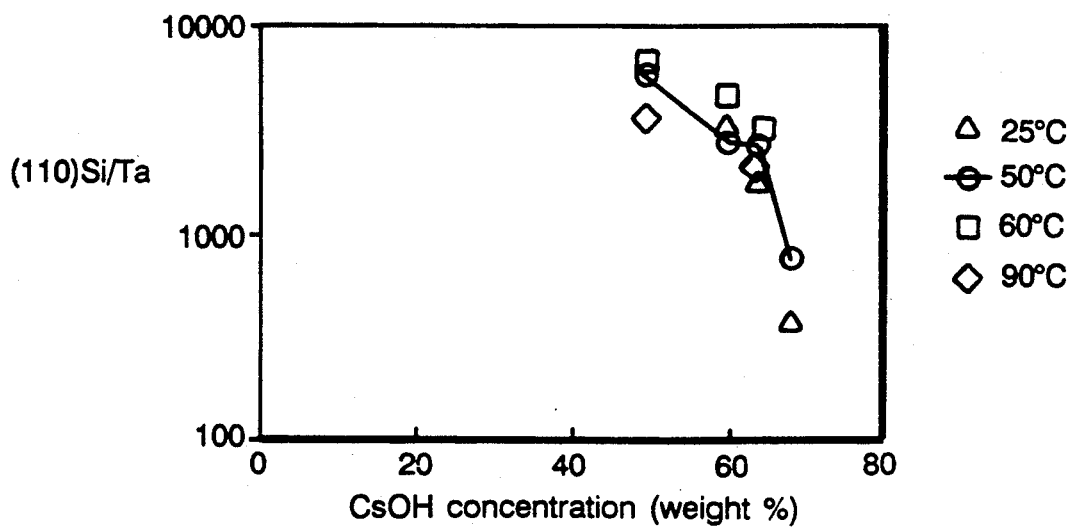
FIG. 12 is a graph of the ratio of the (110) silicon etch rate to the tantalum etch rate as a function of cesium hydroxide concentration at various temperatures.

FIG. 12 shows a (110) silicon to tantalum etch rate ratio that is nearly insensitive to temperature and that reaches a maximum at 50% by weight cesium hydroxide solution.

Figure 13:
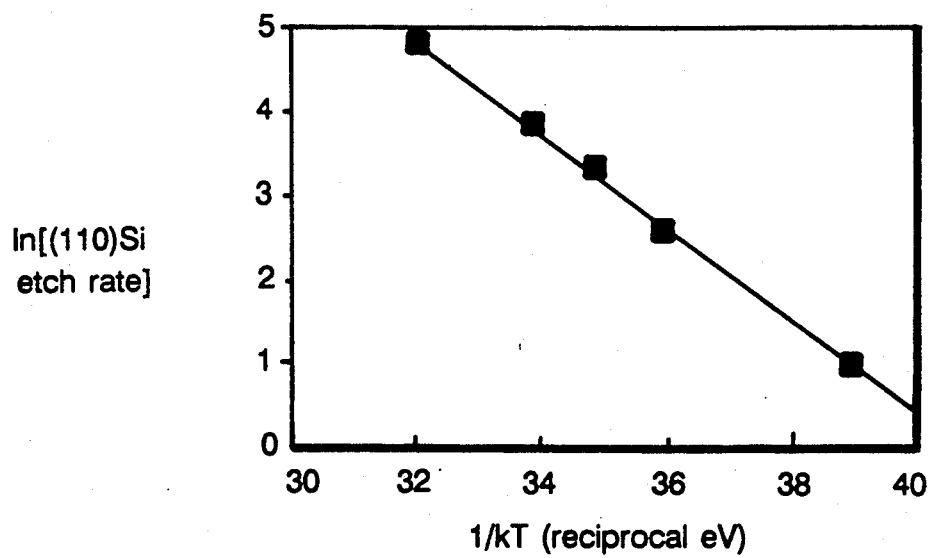
FIG. 13 is a graph of ln [(110) Si etch rate] as a function of 1/kT for a 50% by weight cesium hydroxide concentration etch solution.
Figure 14:
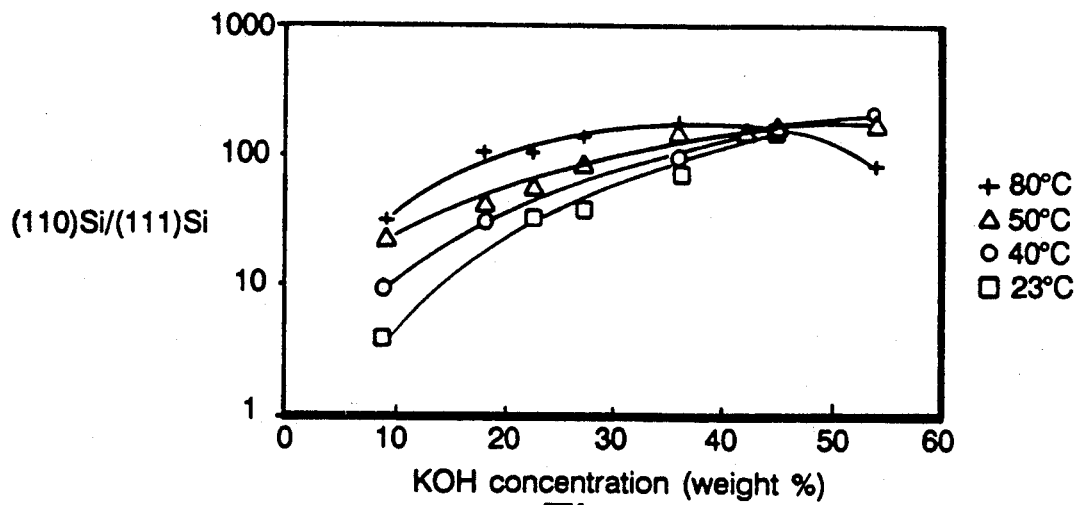
FIG. 14 is a graph of the ratio of the 110/111 silicon etch rates as a function of potassium hydroxide concentration at various temperatures.
Figure 15:
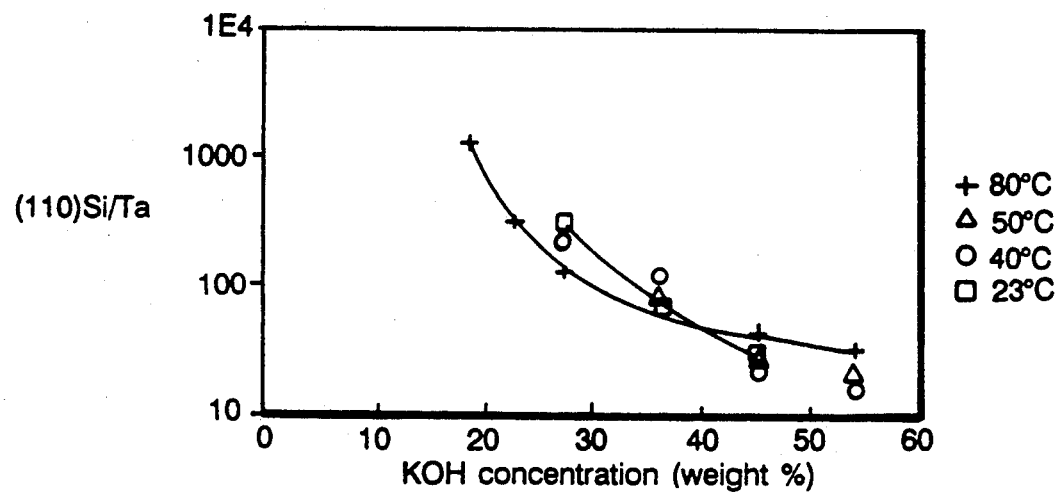
FIG. 15 is a graph of the ratio of the (110) silicon etch rate to the tantalum etch rate as a function of potassium hydroxide concentration at various temperatures.
Figure 16:
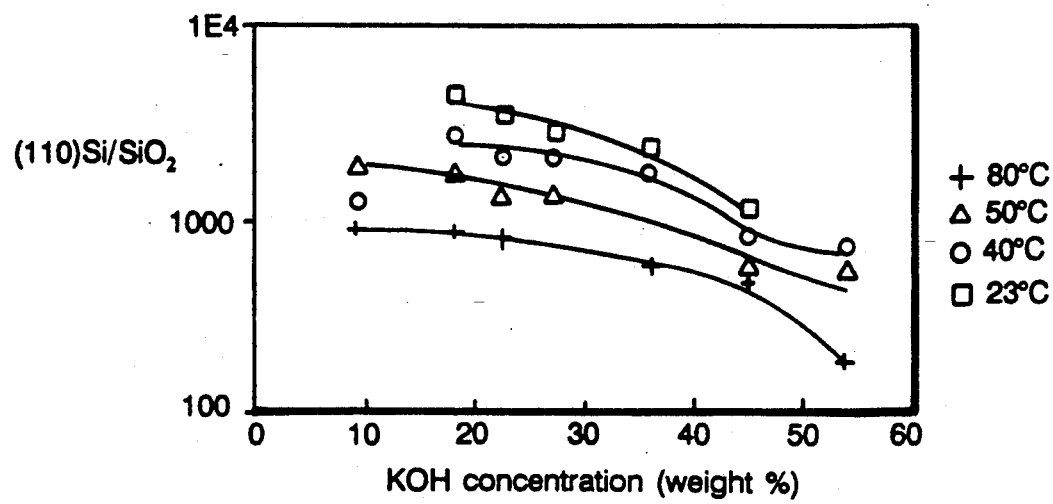
FIG. 16 is a graph of the ratio of the (110) silicon etch rate to the $SiO_2$ etch rate as a function of potassium hydroxide concentration at various temperatures.

FIG. 13 shows a linear relationship between ln [(110) Si etch rate] and 1/kT. It demonstrates that the etching of (110) silicon is an activated process, characterized by an activation energy which is given by the slope of this line. An etch solution of 60% by weight cesium hydroxide has a high etch selectivity value of 200 and at 70° C. provides for rapid etching of the (110) silicon, without overly aggressive etching of the silicon dioxide mask or tantalum metallization layers.

More generally, good results may be obtained by selecting a cesium hydroxide concentration between 10% and 68% by weight and a temperature between 0° C. and 100° C. as determined based upon the requirements for the piece being etched.

The etching experiments also exhibited a general relationship between the CsOH concentration and the smoothness of the (110) Si surface produced. Lower concentrations of CsOH produced rough (110) surfaces with more than 10 µm of peak-to peak roughness. The highest concentrations of CsOH produced smoother (110) Si surfaces with peak to peak roughness values of less than 1 µm as observed using microscope focal plane height variation methods.

The temperature and cesium hydroxide concentration of a particular etch are determined based upon the requirements and characteristics of the workpiece to be etched. Requirements include desired surface smoothness and etch rate. Another factor which must be considered in selection of the temperature and cesium hydroxide concentration of the etch is the relationship between the etch rate activation energies of the materials on the workpiece, hence their relative etch rates.

Lower, approximately 10% by weight CsOH, concentrations in solutions held at 70° C. can be used to produce rough (110) Si surfaces when surface roughness is desirable to enhance adhesion and bonding. An etch solution containing 60% by weight CsOH at 70° C. has a high selectivity of 200 and achieves rapid etching of (110) silicon, while only negliqibly etching a silicon dioxide mask or tantalum metallization. This 60% by weight CsOH etch takes advantage of the fact that the etch rate activation energies for the (110) and (111) crystalline orientations of Si are very similar. This similarity results in a ratio of 110/111 silicon etch rates which at a fixed CsOH concentration is nearly temperature independent. The etch rate activation energy for $SiO_2$ is substantially larger than that for (110) Si, resulting in a highly temperature dependent $Si/SiO_2$ selectivity. This feature offers substantial advantages for fabrication of microsensors where high selectivity is required with respect to the etching of particular crystal orientations and other materials used in fabrication of the sensor.

Complex circuit-sensor integrated systems, for example, can be produced simply with good dimensional control. Trenches can be etched into silicon to form dielectrically isolated integrated circuits. Ultrafine scale microstructures can be chemically micromachined in (110) silicon. Diaphragms for pressure transducers can be made because the high selectivity of the cesium hydroxide etch produces smooth bottomed etch cavities. Cesium hydroxide has relatively low toxicity.

Figure 17:
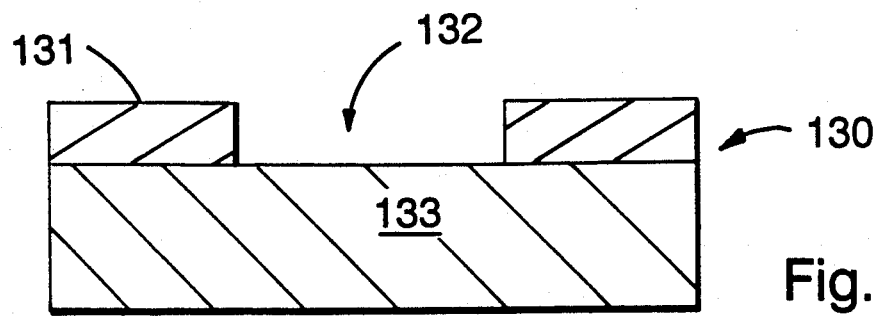
FIG. 17 is a sectional side view of a masked (110) silicon wafer.
Figure 18:
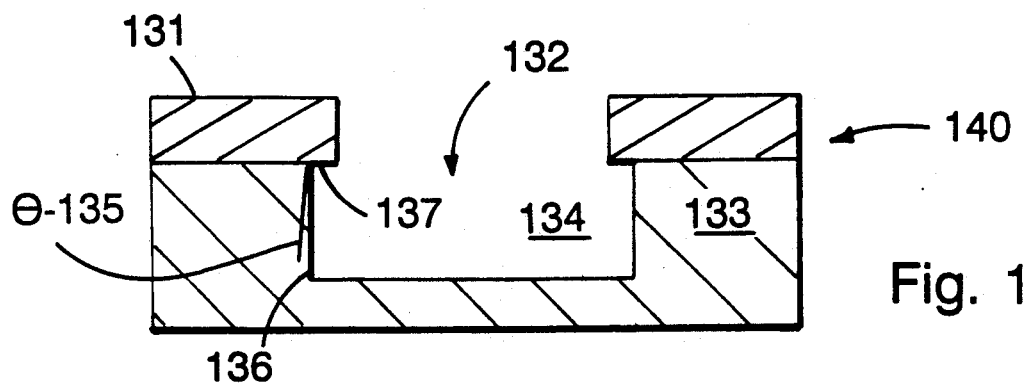
FIG. 18 is a sectional side view of a pit etched into a (110) silicon wafer before removal of the mask.
Figure 19:
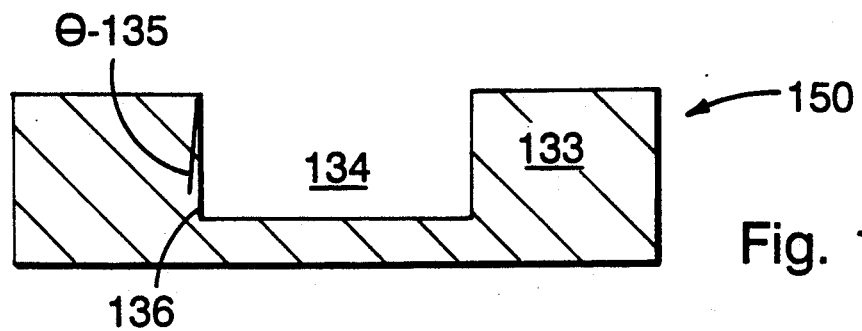
FIG. 19 is a sectional side view of the pit after removal of the mask.

FIG. 17 shows a masked silicon workpiece 130. A patterned silicon dioxide mask 131 defines a feature 132 to be etched into a silicon wafer substrate 133. After exposure to the cesium hydroxide etch, the workpiece 130 has the structure shown in FIG. 18. The area where the silicon dioxide mask 131 was absent, defining the feature 132 has now been etched away to produce an etch pit 134. An angle θ 135 defines the steepness of a side wall 136 of the etch pit 134 and depends on the orientation of the crystal. In certain orientations, the 110 direction has a θ of 0 degrees. The degree of undercutting is governed by the etch selectivity. The silicon dioxide mask 131 is removed to yield a finished etched silicon structure 150 (FIG. 19) which consists of the etch pit 134 with side walls 136 whose steepness is defined by the angle θ 135.

Figure 20:
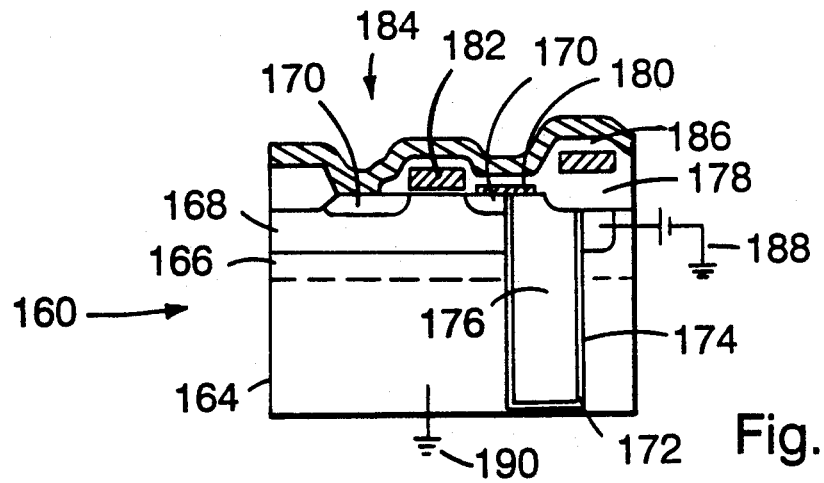
FIG. 20 is a sectional side view of a trench capacitor cell.

Referring to FIG. 20, a substrate-plate trench-capacitor cell 160 is fabricated on a p-type silicon substrate 164. A p-type epitaxial silicon layer 166 is grown on the p-type silicon substrate 164. Above the p-type epitaxial silicon layer is grown an n-well 168 consisting of n doped silicon. Using masking technoloqy and diffusion, p-type regions 170 are created in the previously deposited n well 168. The cesium hydroxide etch is used to etch a trench 172 in the structure consisting of the p-type silicon substrate 164, the p-type epitaxial silicon layer 166, the n-well 168, and the p-type regions 170. The trench 172 requires a large depth to width ratio and its fabrication demands a highly selective anisotropic etch. A thin insulator 174 is deposited to form a lining of the trench 172 The thin insulator 174 may consist of a combination of silicon dioxide and silicon nitride. The trench 172 is filled with a deposit of p-type polycrystalline silicon 176. A silicon dioxide layer 180 is used to isolate the trench 172 and the p-type region 170. A silicon dioxide layer 182 serves as a gate for an n channel transistor 184 consisting of the n-well 168 and the p-type regions 170. In operation of the substrate-plate trench capacitor cell 160, a bias is supplied to the n-well 168 from an external source 188 and charge is stored in the thin insulator layer 174. Electrical contact is made to the device using a silicide layer 186. A ground 190 is provided to the p-type silicon substrate 164.

Figure 21A:
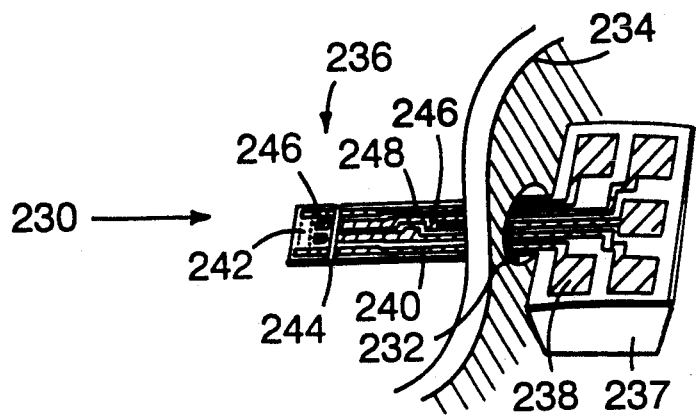
FIG. 21a is an isometric view of a gas flow sensor.

A gas flow sensor 230, FIG. 21a, is inserted through a hole 232 in a tube wall 234 for sensing gas flow in the direction given by an arrow 236. The gas flow sensor 230 consists of three parts, a base plate 237 with five electrical bonding pads 238, a silicon beam 240 which extends from the base plate 237 through the hole in the tube wall 232 and a chip assembly 242 which is located at the far end of the silicon beam 240. The chip assembly 242 constitutes the active part of the sensor The chip assembly 242 is attached to the silicon beam 240 by a polyimide bridge 244 which is thermally insulating. The chip assembly 242 is heated electrically by dissipation by an integrated 100 ohm ion implanted resistor, not shown. Ion implanted diodes 246 integrated on the chip and positioned on the silicon beam 240 sense temperature. The diodes 246 and the resistor, together with an external temperature regulator, control the chip temperature. The gas flow sensor 230 measures gas flow based on heat transfer by convective cooling between the sensor and the gas flow. Four electrical conductors 248 connect the chip assembly to the silicon beam 240 and to the base plate 236.

Figure 21B:
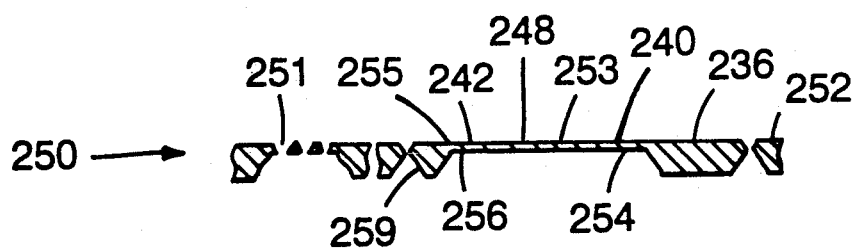
FIG. 21b is a sectional side view of a gas flow sensor at an intermediate stage of its fabrication

Referring to FIG. 21b, production of a silicon wafer structure 250 which underlies the gas flow sensor 230 can be accomplished using the highly selective, anisotropic cesium hydroxide etch. An array of holes 251 are etched in an upper surface 252 of a silicon wafer. A silicon membrane 253 is etched from a rear surface 254 of the silicon wafer structure 250.

Standard process steps of photolithography and ion implantation, well known in the art, are used to form the resistor, not shown, diodes 246 and electrical connections 248 shown in FIG. 21a. A layer of silicon dioxide 256 is deposited on a rear surface 254 of the silicon wafer structure 250. A brief silicon etch on the upper surface 252 of the wafer structure 250 is used to define the base plate 237, the silicon beam 240, and the chip assembly 242. The cesium hydroxide etch is used to cut a channel 255, leaving uncovered a silicon dioxide membrane 256 which connects the chip to the remainder of the silicon wafer 250. Face 259 is the 100 crystal plane.

Figure 22:
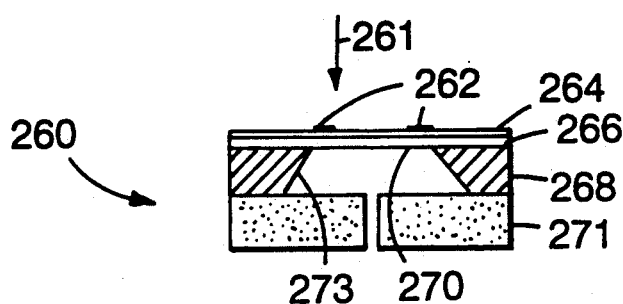
FIG. 22 is a sectional side view of a diaphragm for a pressure transducer.

Referring to FIG. 22, a pressure sensor 260 is designed to detect pressure exerted in the direction indicated by an arrow 261. The pressure sensor 260 consists of polysilicon piezoresistors 262, a silicon dioxide layer 264, an epitaxial silicon layer 266, and a silicon layer 268 A diaphragm 270 is etched into the silicon layer using the highly selective anisotropic cesium hydroxide etch. The silicon layer 268 is attached to a support plate 271 using an an adhesive appropriate for the particular application of the pressure sensor 260. Surface 273 is the 100 crystal plane.

Other embodiments are within the following claims. For example, other substances may be added to the CsOH solution to improve its properties including surfactants and complexing agents. Other masks can be used, including silicon nitride. The etch may be useful for other semiconductor crystalline materials other than silicon. The cesium etch may be used for orientations other than 110, 111, for example 100/111.

We claim:

1. A method of fabricating a semiconductor device comprising
   providing a semiconductor crystal,
   providing tantalum on said crystal, and
   etching said crystal having said tantalum on it by exposing said crystal and said tantalum to an etch comprising an aqueous solution of cesium hydroxide.

2. The method of claim 1 further comprising maintaining said solution at a temperature in the range between the precipitation temperature and the boiling temperature of said solution.

3. The method of claim 1 further comprising maintaining said solution at a temperature at or above room temperature.

4. The method of claim 1 wherein said solution contains in the range of 10% to 65% by weight cesium hydroxide.

5. The method of claim 1 further comprising masking the crystal in a desired pattern prior to exposing the crystal to the etch.

6. The method of claim 5 wherein said masking comprises applying silicon dioxide to said crystal.

7. The method of claim 1 wherein said semiconductor comprises silicon.

8. The method of claim 7 wherein said etch is applied to a 110 surface of said silicon.

9. The method of claim 1 wherein said tantalum is provided directly on said crystal.

10. A method for anisotropically etching a semiconductor crystal, comprising:
    providing an etch consisting essentially of an aqueous solution of cesium hydroxide;
    providing a semiconductor crystal;
    providing tantalum on said crystal; and
    etching said crystal having said tantalum on it by exposing said crystal and said tantalum to said etch.

11. The method of claim 10 further comprising maintaining said solution at a temperature in the range between the precipitation temperature and the boiling temperature of said solution.

12. The method of claim 10 further comprising maintaining said solution at a temperature at or above room temperature.

13. The method of claim 10 wherein said solution contains in the range of 10% to 65% by weight cesium hydroxide.

14. The method of claim 10 further comprising masking the crystal in a desired pattern, wherein the aqueous solution is a solution of at least 10% by weight cesium hydroxide.

15. The method of claim 10 further comprising masking said crystal in a desired pattern by applying a silicon dioxide mask to said crystal.

16. The method of claim 10 wherein said semiconductor comprises silicon.

17. The method of claim 16 wherein said etch is applied to a 110 surface of said silicon.

18. The method of claim 10 wherein said tantalum is provided directly on said crystal.

19. A method for anisotropically etching a semiconductor crystal, comprising:
    providing an aqueous solution of cesium hydroxide as an etch;
    providing a semiconductor crystal;
    providing tantalum on said crystal; and
    etching said crystal having said tantalum on it by exposing said crystal and said tantalum to said etch in the absence of a passivating agent.

20. The method of claim 19 further comprising maintaining said solution at a temperature in the range between the precipitation temperature and the boiling temperature of said solution.

21. The method of claim 19 further comprising maintaining said solution at a temperature at or above room temperature.

22. The method of claim 19 wherein said solution contains in the range of 10% to 65% by weight cesium hydroxide.

23. The method of claim 19 further comprising masking the crystal in a desired pattern, wherein the aqueous solution is a solution of at least 10% by weight cesium hydroxide.

24. The method of claim 19 further comprising masking said crystal in a desired pattern by applying a silicon dioxide mask to said crystal.

25. The method of claim 19 wherein said semiconductor comprises silicon.

26. The method of claim 25 wherein said etch is applied to a 110 surface of said silicon.

27. The method of claim 19 wherein said tantalum is provided directly on said crystal.

28. A method for anisotropically etching a semiconductor crystal, comprising:
    providing an aqueous solution of cesium hydroxide comprising in the range of 10% to 65% by weight cesium hydroxide as an etch;
    providing a semiconductor crystal;
    providing tantalum on said crystal; and
    etching said crystal having said tantalum on it by exposing said crystal and said tantalum to said etch.

29. The method of claim 28 further comprising maintaining said solution at a temperature in the range between the precipitation temperature and the boiling temperature of said solution.

30. The method of claim 28 further comprising maintaining said solution at a temperature at or above room temperature.

31. The method of claim 28 further comprising masking the crystal in a desired pattern.

32. The method of claim 28 further comprising masking said crystal in a desired pattern by applying a silicon dioxide mask to said crystal.

33. The method of claim 28 wherein said semiconductor comprises silicon.

34. The method of claim 33 wherein said etch is applied to a 110 surface of said silicon.

35. The method of claim 28 wherein said tantalum is provided directly on said crystal.

36. A method for anisotropically etching a 110 surface of a silicon crystal, comprising:
   providing an aqueous solution of cesium hydroxide as an etch;
   providing a crystal having a 110 surface;
   providing tantalum on said crystal; and
   etching said crystal having said tantalum on it by exposing the crystal and said tantalum to the etch.

37. The method of claim 36 further comprising maintaining said cesium hydroxide etch at a temperature in the range between the precipitation temperature and the boiling point of the solution.

38. The method of claim 36 further comprising maintaining said cesium hydroxide etch at a temperature at or above room temperature.

39. The method of claim 36 further comprising masking the crystal in a desired pattern, wherein the aqueous solution contains in the range of 10% to 65% by weight cesium hydroxide.

40. The method of claim 39 wherein the masking comprises applying silicon dioxide to said crystal.

41. The method of claim 36 wherein said tantalum is provided directly on said crystal.

* * * * *

UNITED STATES PATENT AND TRADEMARK OFFICE
CERTIFICATE OF CORRECTION

PATENT NO. : 5,116,464

DATED : May 26, 1992

INVENTOR(S) : David J. Edell, Lloyd D. Clark, Jr.

It is certified that error appears in the above-identified patent and that said Letters Patent is hereby corrected as shown below:

Col. 1, line 21; "non noble" should be --non-noble--.

Col. 1, line 24; "pyro catechol" should be --pyro-catechol--.

Col. 1, line 56; "pyro catechol" should be --pyro-catechol--.

Col. 3, line 56; "iso 2" should be --iso-2--.

Col. 4, line 62; "in" should be --In--.

Col. 6, line 9; "technoloqy" should be --technology--.

Col. 6, line 15; "depth to width" should be --depth-to-width--.

Col. 6, line 39; insert --.-- after "sensor".

Col. 6, line 52; "236" should be --237--.

Signed and Sealed this

Fourteenth Day of September, 1993

Attest:

BRUCE LEHMAN

Attesting Officer

Commissioner of Patents and Trademarks